Nov. 10, 1964

W. P. HOLLINGER 3,156,880

LUMPED CONSTANT FILTER

Filed Aug. 4, 1960

INVENTOR.
WALTER P. HOLLINGER
BY
Hurvitz & Rose
ATTORNEYS

United States Patent Office 3,156,880

Patented Nov. 10, 1964

3,156,880

LUMPED CONSTANT FILTER

Walter Philip Hollinger, Bronxville, N.Y., assignor to Melpar, Inc., Falls Church, Va., a corporation of Delaware Filed Aug. 4, 1960, Ser. No. 47,422

2 Claims. (Cl. 333—73)

The present invention relates generally to electrical filters and more particularly to tunable and adjustable lumped constant filters operative in the UHF region.

Filters presently available in the UHF region include both lumped constant filters and transmission line filters. The latter have many disadvantages. Among these are that such filters must be physically large, that they involve close mechanical tolerances, and that they are not readily tunable and band width adjustable. On the other hand, while known lumped constant filters are physically small, suitable values of capacitance and inductance are hard to realize, and dimensions are critical, so that such filters cannot be reproduced with accuracy.

The present invention provides a novel filter of the lumped constant type, in which mechanical tolerances are relatively unimportant, and in which separate sections of a complex multi-section filter can be adjusted prior to inclusion in the multi-section filter. Both bandwidth and center frequency of multi-section band-pass filters according to the invention can be adjusted after assembly therein of the individual sections, and tolerances of ±.25 percent or better can be held on cut-off frequencies for the overall filter.

When the invention is applied in band-pass filters, composed of cascaded tank circuits, printed circuit techniques are employed in providing the tank capacitances, to eliminate lead inductance. It is an important feature of the invention that stray capacitances between tank capacitors are employed as series coupling capacities between filter sections, and bandwidth of the filter may thus be adjusted by varying the relative physical positions of individual tank circuits employed in the filter, and thus varying the stray series capacitances. Center frequencies can be adjusted slightly by deforming the inductors of the tank circuits, should this become necessary after the sections have been assembled, and provision for physical leads between sections are dispensed with.

While the invention is described and illustrated as pertaining to band-pass filters, as exemplary, the principles of the invention are applicable to band-stop, low pass and high pass filters, as will be evident to those skilled in the pertinent art.

It is, accordingly, a broad object of the present invention to provide a novel multi-section filter of the lumped constant type.

It is a further object of the invention to provide a novel lumped constant filter, composed of multiple tank circuits coupled by series capacitors consisting of stray capacity between tank capacitors, and which are thereby readily adjustable in respect to band width by varying the relative positions of the tank capacitors to vary the stray capacities between filter sections.

A further object of the invention resides in the provision of a band-pass filter composed of multiple shunt tank circuits coupled by series circuit elements composed entirely of leakage capacitances between tank circuit capacitors, whereby band-width may be readily varied by changing the relative physical positions of the tank circuits.

Still another object of the invention is the provision of a novel tank circuit, employing a printed circuit capacitor and a lumped inductance mounted on the capacitor and directly connected to the plate of the capacitor.

The above and still further objects, features and advantages of the present invention will become apparent upon consideration of the following detailed description of one specific embodiment thereof, especially when taken in conjunction with the accompanying drawings, wherein.

Figure 3:
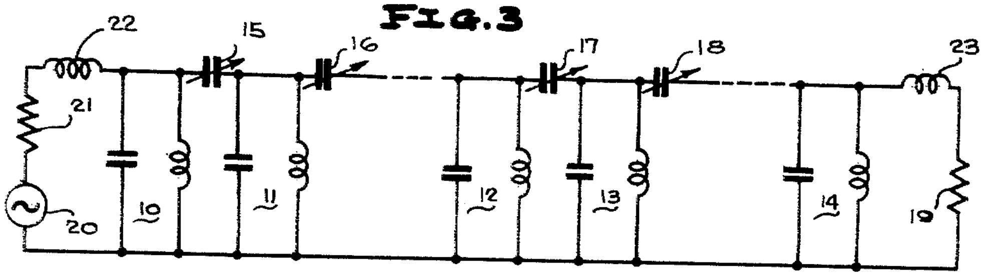
FIGURE 3 is a schematic circuit diagram of a filter of the band-pass type employing shunt tank circuits connected in cascade by means of series coupling capacitors.

The design of band-pass filters of the type illustrated in FIGURE 3 of the accompanying drawings is discussed in an article by S. B. Cohn, published in the Proceedings of the Institute of Radio Engineers, February 1957. Design formulas are there provided, and accordingly, are not discussed herein.

The circuit of FIGURE 3 is composed of a plurality of shunt tank circuits 10, 11, 12, 13 and 14, coupled in cascade by means of series capacitors 15, 16, 17 and 18. Resistance 19 is an output load, and a generator 20 supplies signal to the filter through a resistance 21, which may be inherent in the generator 20. The series inductances 22 and 23 may be of different relative values and are required to obtain optimum design, value considerations in selecting the inductances and other circuit elements being provided in terms of the design formulas provided in the above-referred-to article by Cohn.

The center frequencies of the parallel tank circuits 10 to 14, inclusive, are all predesigned so each section is assembled prior to insertion in the filter. The series capacities 15 to 18, inclusive, are, according to the present invention, constituted of leakage capacities between the capacitors of tanks 10 to 14, inclusive, and are adjustable to vary the bandpass of the filter.

Figures 1, 2:
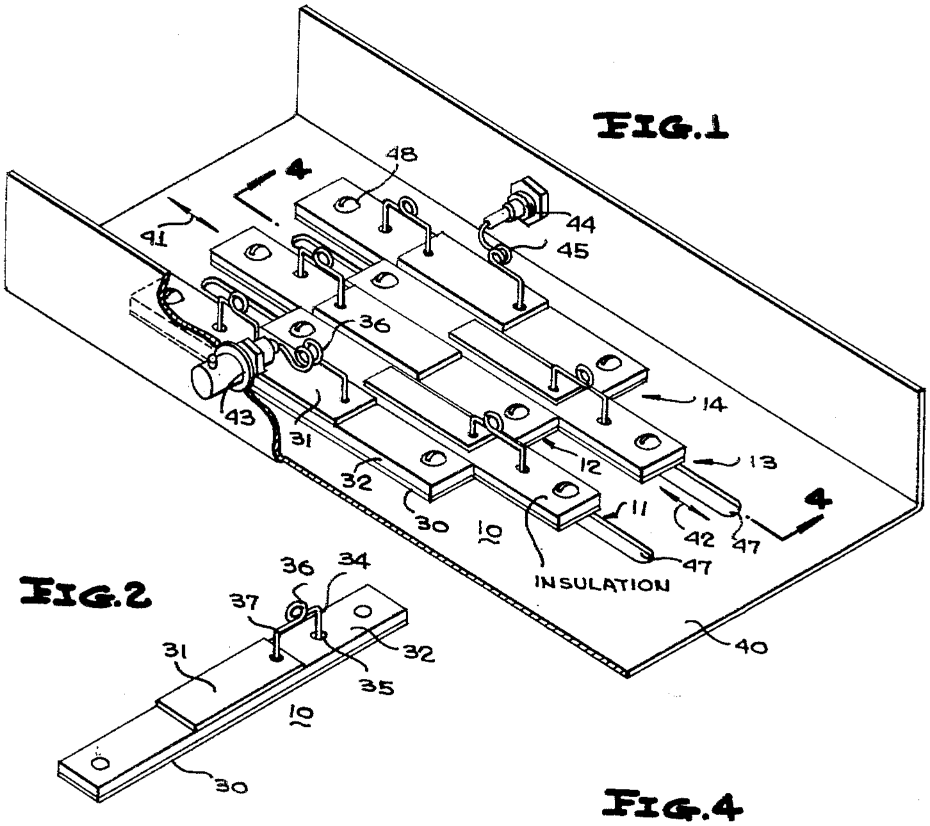
FIGURE 1 is a view in perspective of an idealized band-pass filter arranged in accordance with the invention.
FIGURE 2 is a view in perspective of a single tank circuit employed in the filter of FIGURE 1.
Figure 4:
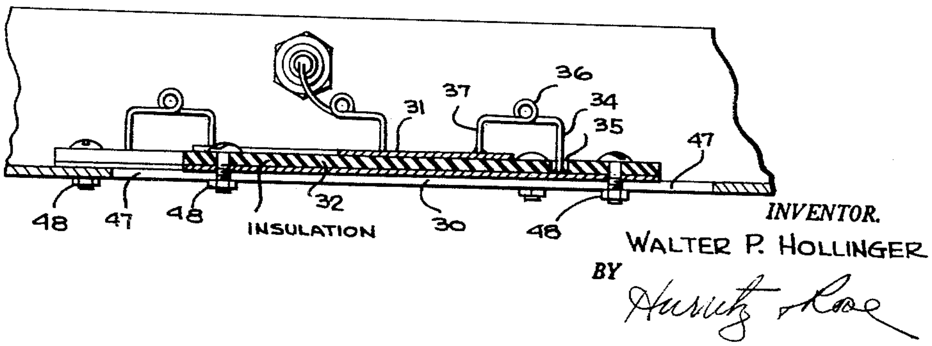
FIGURE 4 is a view in section taken on line 4—4 of FIGURE 1.

Reference is made to FIGURE 2 of the drawings, wherein is illustrated a single representative tank circuit, say 10, according to the invention. The tank circuit 10 is composed of a metallic plate 30, which is separated from a further plate 31 by a sheet of dielectric material 32. An opening or passage 35 is provided which extends through the dielectric sheet 32, to the metallic plate 30, and provides clearance for lead 34 of a coil 36, the remaining lead 37 of which is soldered to the metallic plate 31. Lead 34 is soldered to plate 30. The metallic plates 30, 31, separated by the dielectric sheet 32, constitute a capacitor, across which the coil 36 is connected, to provide a tank circuit. Inductance can be varied by deforming the coil 36 slightly, tank capacitance being invariable.

FIGURE 1 illustrates the physical arrangement of a multi-section filter arranged according to the invention, and comprises a group of tank circuits 10 to 14, of the type illustrated in FIGURE 2, the several tank circuits 10 to 14 lying side by side on a metallic ground plane 40. The lower plates 30 of the tank circuits make electrical and physical contact with the ground plane 40. The upper plates 31 lie adjacent to one another in a common plane, but recede sufficiently from the edges of the dielectric sheets 32 on which they are mounted, that they are mutually insulated from one another. Nevertheless, leakage or stray capacitance exists as between adjacent ones of the tank capacitors. The leakage or stray capacitances, corresponding with capacitors 15 to 18, of FIGURE 3, can be adjusted by moving selected ones of the tank circuits as 11, 12, 13, with respect to tank circuits 10 and 14, which remain stationary, in the directions of arrows 41, 42.

To avoid inductive coupling, the coils 35 are located on opposite sides of the plates 31, in alternate ones of the tanks 10 to 14.

An input co-axial connector 43 may be connected to inductance 36, and an output co-axial connector 44 to inductance 45, the connectors being mounted on walls integral with ground plane 40, and extending perpendicularly thereof, for convenience.

In fabricating a complete filter the separate tank circuits, as 10, 11, 12, 13, 14 may be separably constructed, and adjusted, in respect to center frequency, before assembly in the complete filter. The tanks may be then inserted in the filter structure of FIGURE 1, the edges of dielectric sheets 32 being arranged in contact or proximity. The tanks 11 and 13, or 11, 12, 13 as desired, may be moved relative to the remaining tanks, to adjust bandwidth by longitudinal movement only, by securing these in elongated slots 47, as by bolts 48.

It will be apparent that provision may be made for adjusting or varying the positions of all of tanks 10 to 14, rather than tanks 11 and 13 alone. However, this is not essential, in practice.

While I have described and illustrated one specific embodiment of the present invention, it will become apparent that various of the specific details of construction may be resorted to without departing from the true spirit and scope of the invention as defined in the appended claims.

What I claim is:

1. A band pass filter, comprising a plurality of elongated strips of dielectric material each having an opening extending from a first face to a second opposite face, first and second metallic coatings on said first and second faces of each of said strips of dielectric material, a metallic ground plane, each of said strips lying adjacent to and parallel with another strip, said first metallic coatings of each of said strips being in flat contact with said metallic ground plane, a coil associated with each of said elongated strips of dielectric material, said coils each having a first lead connected directly to a second metallic coating and a second lead connected via one of said openings to a first metallic coating of an associated one of said elongated strips of dielectric material, said elongated strips of dielectric material being longitudinally movable with respect to one another while maintaining said contacts with said ground plane, said second coatings being mutually insulated, whereby each elongated strip of dielectric material and its associated coatings and coil form a tank circuit, said tank circuits being coupled to one another solely via stray capacities between said second coatings, the coils associated with adjacent ones of said strips being spatially displaced with respect to one another sufficiently to essentially decouple said coils from one another electromagnetically.

2. A filter comprising a plurality of separate filter sections, each of said sections including a shunt capacitor, said filter including series capacities coupling said filter sections, said series capacities consisting of leakage capacities between pairs of said shunt capacitors, each of said shunt capacitors including an elongated strip of dielectric material, each of said strips having a metal coating on each side thereof, a conductive ground plane, one coating of each strip contacting said ground plane, said strips lying adjacent one another with their longitudinal axes substantially parallel to each other, the other coating on each strip being transversely displaced from the other coating on adjacent strips, said transverse displacement being relative to the longitudinal strip axis, and means for at will moving said strips relative to each other along said longitudinal axes to vary said leakage capacities.

References Cited by the Examiner

UNITED STATES PATENTS

| | | | |
|---|---|---|---|
| 2,527,608 | 10/50 | Willoughby | 333—73 |
| 2,702,373 | 2/55 | Pan | 333—73 |
| 2,751,558 | 6/56 | Grieg | 333—73 |
| 2,844,801 | 7/58 | Sabaroff | 333—73 |
| 2,859,417 | 11/58 | Arditi | 333—73 |
| 2,892,163 | 6/59 | Todd | 333—73 |
| 2,937,347 | 5/60 | Matthaei et al. | 333—73 |
| 2,945,195 | 7/60 | Matthaei | 333—84 |
| 2,954,468 | 9/60 | Matthaei | 333—84 |
| 2,968,012 | 1/61 | Alstader | 333—73 |
| 2,984,802 | 5/61 | Dyer | 333—73 |

HERMAN KARL SAALBACH, *Primary Examiner.*

ELI J. SAX, *Examiner.*